(12) United States Patent
Kodama

(10) Patent No.: US 7,952,955 B2
(45) Date of Patent: May 31, 2011

(54) SEMICONDUCTOR MEMORY

(75) Inventor: Tsuyoshi Kodama, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 165 days.

(21) Appl. No.: 12/488,017

(22) Filed: Jun. 19, 2009

(65) Prior Publication Data
US 2010/0054052 A1 Mar. 4, 2010

(30) Foreign Application Priority Data

Sep. 1, 2008 (JP) ................................. 2008-223364

(51) Int. Cl.
*G11C 8/00* (2006.01)
(52) U.S. Cl. .............................. 365/230.06; 365/189.11
(58) Field of Classification Search ............ 365/230.06, 365/189.11, 194, 154
See application file for complete search history.

(56) References Cited

U.S. PATENT DOCUMENTS

| 5,737,275 A | * | 4/1998 | Matthews et al. ............. 365/226 |
| 7,085,175 B2 | * | 8/2006 | Remington et al. ..... 365/189.09 |
| 2007/0030741 A1 | | 2/2007 | Nii et al. |

FOREIGN PATENT DOCUMENTS

| JP | 08-036881 A | 2/1996 |
| JP | 2007-066493 A | 3/2007 |

* cited by examiner

*Primary Examiner* — Anh Phung
(74) *Attorney, Agent, or Firm* — Arent Fox LLP

(57) ABSTRACT

A semiconductor memory is provided which includes a word line coupled to a transistor of a memory cell; a word driver configured to activate the word line; a first resistance portion configured to couple the word line to a low-level voltage line in accordance with an activation of the word line and to decouple the coupling after a first period in an activation period of the word line elapses; a second resistance portion configured to couple the word line to a high-level voltage line in a second period in the activation period; and a third resistance portion configured to couple the word line to the low-level voltage line in the second period, a resistance of the third resistance portion being higher than a resistance of the first resistance portion, wherein a high-level voltage of the word line in the second period is lower than that of the high-level voltage line.

11 Claims, 12 Drawing Sheets

"SEMICONDUCTOR MEMORY

CROSS-REFERENCE TO RELATED APPLICATIONS

The present Application for Patent claims the benefit of priority from Japanese Patent Application No. 2008-223364 filed on Sep. 1, 2008, the entire contents of which are incorporated herein by reference.

BACKGROUND

1. Field

The embodiments discussed herein relate to a semiconductor memory.

2. Description of Related Art

As transistors are manufactured using finer design rules, a power supply voltage that is supplied to a semiconductor memory is decreased. Accordingly, variations in the electric characteristics of the transistors such as variations in the threshold voltages of the transistors in a static memory cells occur due to a manufacturing processes of the transistors. The variations in the electric characteristics of the transistors lead to instability of operations of the memory cells, and the yield of the semiconductor memories is reduced.

In order to avoid the aforementioned variations in the electric characteristics of the transistors in the memory cells, a method for adjusting a high-level voltage of a word line in accordance with the electric characteristics of transistors in memory cells is disclosed, for example, in Japanese Laid-Open Patent Publication No. 2007-66493. Further, a word driver having a latch function for avoiding a malfunction that is caused by noise of address signals is disclosed, for example, in Japanese Laid-Open Patent Publication No. H8-36881.

SUMMARY

According to one aspect of embodiments, A semiconductor memory is provided which includes a memory cell; a word line coupled to a transfer transistor of the memory cell; a word driver configured to activate the word line; a first resistance portion configured to couple the word line to a low-level voltage line in accordance with an activation of the word line and to decouple the coupling after a first period in an activation period of the word line elapses; a second resistance portion configured to couple the word line to a high-level voltage line in a second period in the activation period wherein the second period is not included in the first period; and a third resistance portion configured to couple the word line to the low-level voltage line in the second period, a resistance of the third resistance portion being higher than a resistance of the first resistance portion, wherein a high-level voltage of the word line in the second period is lower than that of the high-level voltage line by a resistance voltage division of the second resistance portion and the third resistance portion.

Additional advantages and novel features of the invention will be set forth in part in the description that follows, and in part will become more apparent to those skilled in the art upon examination of the following or upon learning by practice of the invention.

DESCRIPTION OF EMBODIMENTS

For example, it is preferable that a high-level voltage of a word line promptly decreases to a given value without an increase in power consumption. Furthermore, for example, it is preferable that a high-level voltage of a word line be adjusted in accordance with a change in the electric characteristics of p-channel metal oxide semiconductor (PMOS) transistors of a memory cell.

In FIGS. 1 to 12, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol prefixed with a symbol "/" indicates a negative logic. A double-square symbol represents an external terminal such as a pad on a semiconductor chip or a lead of a package containing the semiconductor chip therein. Terminals and signals supplied through the terminals, respectively, are denoted by like reference symbols.

Figure 1:
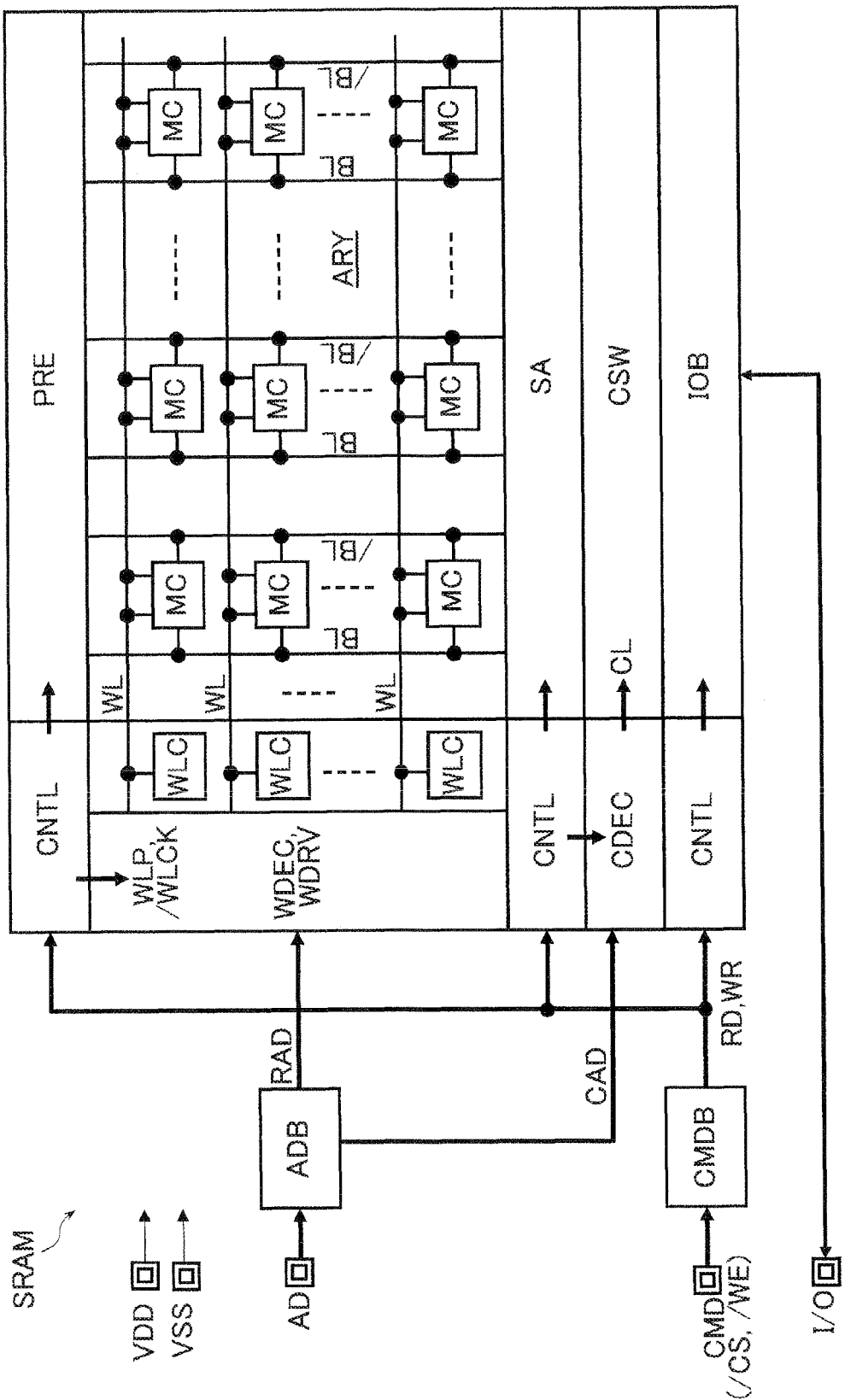
FIG. 1 illustrates a first embodiment.

FIG. 1 illustrates a first embodiment. For example, a semiconductor memory may be a static random access memory (SRAM). The semiconductor memory may be a semiconductor memory housed in a package. The semiconductor memory may be a memory macro (an intellectual property core (IP)) that is embedded in a system large scale integrated circuit (system LSI) or the like. The semiconductor memory may be a non-clock-synchronized-type semiconductor memory or a clock-synchronized-type semiconductor memory.

The SRAM is formed on a silicon substrate, for example, using a complementary metal oxide semiconductor (CMOS) process. The SRAM includes an address buffer ADB, a command buffer CMDB, a word decoder WDEC, word drivers WDRV, word line control circuits WLC, a column decoder CDEC, control circuits CNTL, a pre-charge unit PRE, a memory cell array ARY, a sense amplifier unit SA, a column switch unit CSW, and a data input/output unit IOB. For example, these circuits operate based on a power supply voltage VDD that is supplied to an external terminal.

The address buffer ADB receives address signals AD via address terminals, and outputs the received address signals AD to the word decoder WDEC and the column decoder CDEC. The command buffer CMDB receives command signals CMD, such as a chip select signal /CS and a write enable signal /WE, via command terminals. The command buffer CMDB decodes the received command signals CMD, and outputs a read control signal RD or a write control signal WR to each of the control circuits CNTL. The control circuit CNTL receives the read control signal RD or the write control signal WR, and outputs control signals, such as timing signals, for causing the word decoder WDEC, the word drivers WDRV, the column decoder CDEC, the pre-charge unit PRE, the sense amplifier unit SA, and the data input/output unit IOB to operate.

The word decoder WDEC decodes the high order bits of the address signals AD, for example, a row address RAD, and selects one of the word drivers WDRV. The selected word driver WDRV activates a corresponding one of word lines WL, which are indicated by the row address RAD, from a low level, for example, a ground VSS, to a high level, for example, a power supply voltage VDD for a given period. The word decoder WDEC and the word driver WDRV operate in response to a word clock signal /WLCK and a word activate signal WLP, which is supplied from an appropriate one of the control circuits CNTL.

Each of the word line control circuits WLC adjusts a high-level voltage of a corresponding one of the word lines WL in accordance with the electric characteristics of memory cells MC. The column decoder CDEC decodes the low order bits of the address signals AD, for example, a column address CAD. The column decoder CDEC activates, for example, one of column select signals CL, which corresponds to bit line pairs BL and /BL that are indicated by the column address CAD, from a low level, for example, a ground VSS, to a high level, for example, a power supply voltage VDD for a given period. The pre-charge unit PRE pre-charges the bit line pairs BL and /BL to a high level in a period in which the memory cells MC are not accessed, and stops pre-charging when the memory cells MC are accessed. The word line control circuit WLC may be formed using a dummy memory cell DMC in the memory cell array ARY.

The memory cell array ARY includes memory cells MC that are disposed in a matrix form. The memory cells MC that are arranged in the horizontal direction in FIG. 1 are coupled to a common word line. The memory cells MC that are arranged in the vertical direction in FIG. 1 are coupled to common bit line pairs BL and /BL. The sense amplifier unit SA includes sense amplifiers, each of which is coupled to one of the bit line pairs BL and /BL. The number of sense amplifiers may be the number of memory cells MC that are coupled to one word line WL, for example, 1024. Each of the sense amplifiers amplifies the difference between voltages of the bit line pairs BL and /BL, thereby determining a logical value of read data from the memory cell MC.

The column switch unit CSW includes column switches for coupling the corresponding bit line pairs BL and /BL to the data input/output unit IOB. Each of the column switches is turned on when a corresponding column select signal CL is at a high level, and couples a corresponding bit line pairs BL and /BL, which are indicated by the column address CAD, to the data input/output unit IOB. For example, 16 column switches are turned on in accordance with one column address CAD.

When a read operation is performed, the data input/output unit IOB outputs 16-bit data, which is supplied via the column switches, among plural-bit read data which has been determined by the sense amplifier unit SA to a data input/output terminal I/O. The data input/output terminal I/O is, for example, a 16-bit terminal. When a write operation is performed, the data input/output unit IOB outputs 16-bit write data, which is supplied from the data input/output terminal I/O, to the sixteen bit line pairs BL and /BL that are selected by the column switches. When a write operation performed, the write data is written into the 16 memory cells MC that are selected in accordance with the column address CAD. Although the operation of the remaining memory cells MC that are coupled to the word line WL corresponding to the memory cells MC into which the write data is written is substantially the same as the read operation, no data is output to the data input/output terminal I/O.

Figure 2:
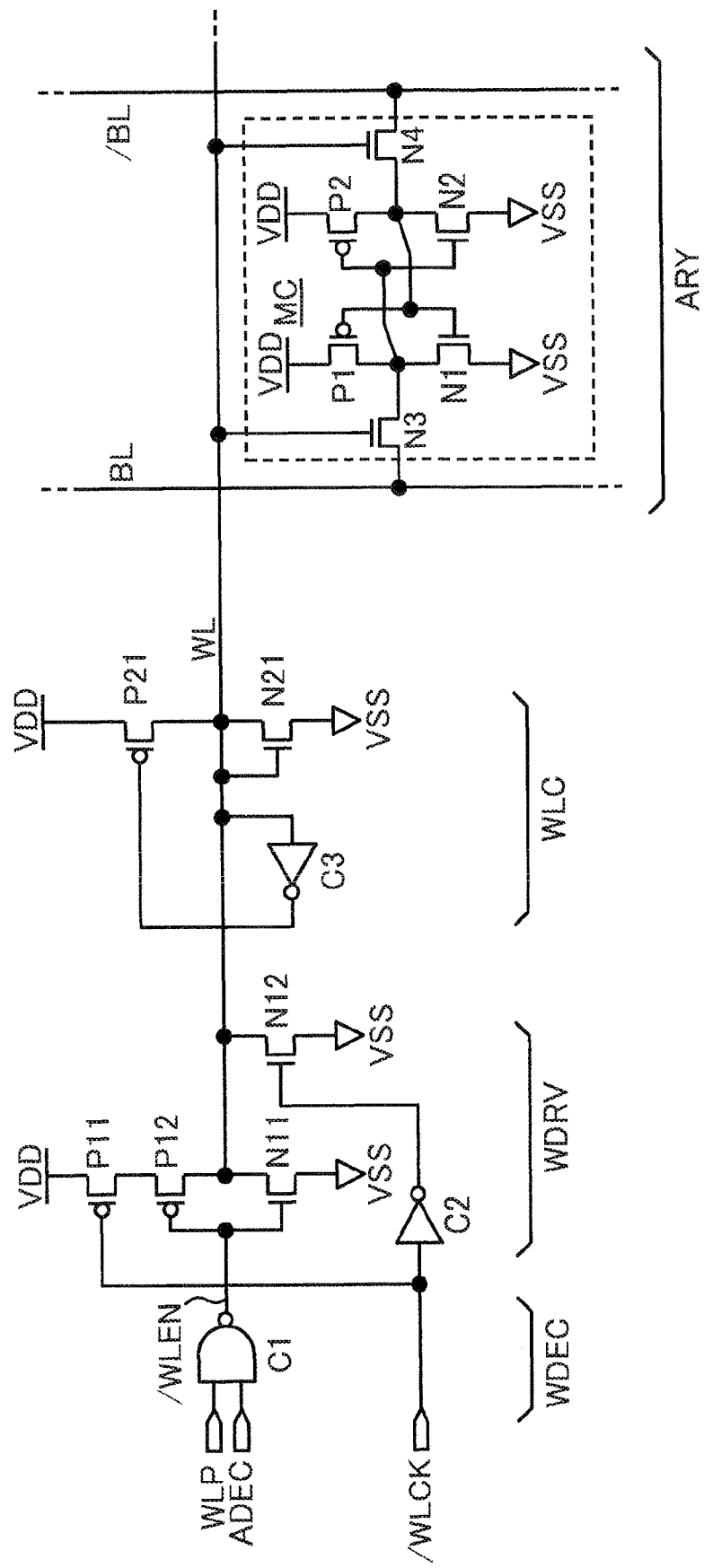
FIG. 2 illustrates an exemplary word decoder, an exemplary word driver, an exemplary word line control circuit, and an exemplary memory cell array.

FIG. 2 illustrates an exemplary word decoder, an exemplary word driver, an exemplary word line control circuit, and an exemplary memory cell array. For example, the exemplary word decoder, the exemplary word driver, the exemplary word line control circuit, and the exemplary memory cell array may be the word decoder WDEC, one of the word drivers WDRV, one of the word line control circuits WLC, and a portion of the memory cell array ARY illustrated in FIG. 1, respectively. The word decoder WDEC, the word driver WDRV, and the word line control circuit WLC that are illustrated in FIG. 2 are disposed, for example, for each of the word lines WL.

The word decoder WDEC includes a NAND gate C1. When an address decode signal ADEC for selecting the word line WL is at an active level, for example, a high level, the NAND gate C1 sets a word enable signal /WLEN to a low level in synchronization with the word activate signal WLP. The word decoder WDEC includes a logic circuit that generates the address decode signal ADEC in accordance with the row address RAD. The decode logic of the word decoder WDEC may be NAND of the NAND gate C1. Alternatively, the decode logic of the word decoder WDEC may be decode logic which receives a plurality of address decode signals ADEC and the word activate signal WLP.

The word driver WDRV includes PMOS transistors P11 and P12 and an n-channel metal oxide semiconductor (NMOS) transistor N11 that are disposed in series between a power supply voltage line VDD and a ground line VSS. The gate of the transistor P11 receives the word clock signal /WLCK. The gates of the transistors P12 and N11 receive the word enable signal /WLEN. The drains of the transistors P12 and N11 are coupled to the word line WL. The source of the PMOS transistor P11 may be coupled to a high-level voltage line other than the power supply voltage line VDD.

The word driver WDRV includes an NMOS transistor N12 that is disposed between the word line WL and the ground line VSS. The NMOS transistor N12 may be disposed outside the word driver WDRV. The source of the NMOS transistor N12 may be coupled to a low-level voltage line other than the ground line VSS. The gate of the transistor N12 receives the word clock signal /WLCK via a CMOS inverter C2. When the word clock signal /WLCK is at a low level, the transistor N12 is turned on so as to couple the word line WL to the ground line VSS. In this case, the transistor N12 operates as a resistor. A current that flows from the word line WL having a high level to the ground line VSS is determined in accordance with an on-resistance of the transistor N12. When both the word enable signal /WLEN and the word clock signal /WLCK are at a low level, the word driver WDRV activates the word line WL to a high level.

The word line control circuit WLC includes a PMOS transistor P21 and an NMOS transistor N21 that are disposed in series between the power supply voltage line VDD and the ground line VSS, and a CMOS inverter C3 that inverts a signal of the word line WL and outputs the inverted signal to the gate of the transistor P21. The source of the PMOS transistor P21 may be coupled to a high-level voltage line other than the power supply voltage line VDD. The source of the NMOS transistor N21 may be coupled to a low-level voltage line other than the ground line VSS.

The gate of the transistor P21 receives the output of the CMOS inverter C3 as a control voltage. When the word line WL is at a high level, the transistor P21 is turned on so as to couple the word line WL to the power supply voltage line VDD. In this case, the transistor P21 operates as a resistor.

The gate of the transistor N21 is coupled to the word line WL, and receives a voltage of the word line WL as a control voltage. When a high-level voltage of the word line WL exceeds the threshold voltage of the transistor N21, the transistor N21 is turned on so as to couple the word line WL to the ground line VSS. In this case, the transistor N21 operates as a resistor. A through current that flows from the power supply voltage line VDD to the ground line VSS via the transistors P21 and N21 is determined in accordance with an on-resistance of the transistor P21 and an on-resistance of the transistor N21.

At least one of the dimensions and the structure of the transistor P21 may be, for example, substantially the same as those of a transistor P2 of the memory cell MC. The electric characteristics of the transistor P21, which include the threshold voltage of the transistor P21 and so forth, may be substantially the same as those of the transistor P2. At least one of the dimensions and the structure of the transistor N21 may be, for example, substantially the same as those of a transistor N2 of the memory cell MC. The electric characteristic of the transistor N21, which include the threshold voltage of the transistor N21, may be substantially the same as those of the transistor N2. The CMOS inverter C3 may include, for example, transistors that are substantially the same as the transistors P1 and N1 of the memory cell MC. For example, the dimensions of the transistor N21 may be smaller than those of the transistor N12. Therefore, the on-resistance of the transistor N21 is higher than that of the transistor N12.

When the word enable signal /WLEN and the word clock signal /WLCK are at a low level, the high-level voltage of the word line WL is determined in accordance with a ratio of on-resistances of the transistors P11, P12 and P21 to the on-resistances of the transistors N12 and N21. The high-level voltage of the word line WL is mainly set in accordance with the transistors P11, P12, and N12 having high drive capabilities. When the word enable signal /WLEN is at a low level and the word clock signal /WLCK is at a high level, the high-level voltage of the word line WL is determined in accordance with a ratio of the on-resistance of the transistor P21 having a low drive capability to the on-resistance of the transistor N21 having a low drive capability.

At least one of the dimensions of the transistors P11, P12, N11, and N12 may be much larger than those of the transistors P21 and N21. For example, the dimensions of the transistors P11, P12, N11, and N12 may be 100 times larger than those of the transistors P21 and N21. Therefore, the drive capabilities of the transistors P11, P12, N11, and N12 are higher than those of the transistors P21 and N21. For example, the dimensions of a transistor are represented by a gate width W of the transistor. For example, the drive capability of the transistor is represented by a ratio W/L that is a ratio of the gate width W to a channel length L. For example, the channel lengths L of the transistors P11, P12, N11, N12, P21, and N21 may be substantially the same.

For example, similar to an SRAM, the memory cell MC includes the PMOS transistors P1 and P2 serving as load transistors, the NMOS transistors N1 and N2 serving as driver transistors, and NMOS transistors N3 and N4 serving as transfer transistors. The structure of the transistor P1 may be substantially the same as that of the transistor P2. The structure of the transistor N1 may be substantially the same as that of the transistor N2. The structure of the transistor N3 may be substantially the same as that of the transistor N4.

Figure 3:
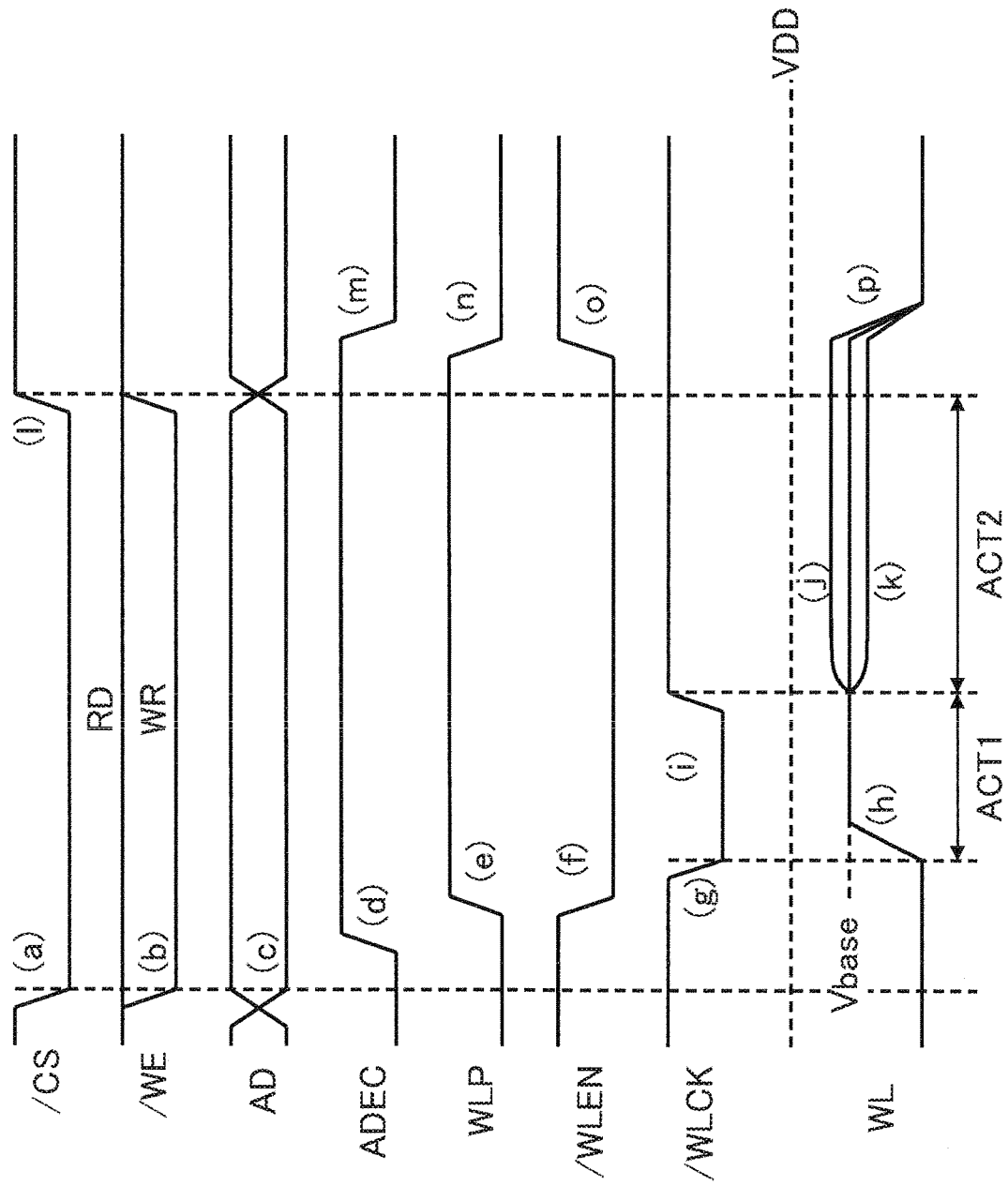
FIG. 3 illustrates exemplary operations of a word decoder, a word driver, and a word line control circuit.

FIG. 3 illustrates exemplary operations of a word decoder, a word driver, and a word line control circuit. For example, the word decoder, the word driver, and the word line control circuit may be the word decoder WDEC, the word driver WDRV, and the word line control circuit WLC illustrated in FIG. 1, respectively. When the SRAM is accessed, the chip select signal /CS is activated to a low level ((a) of FIG. 3). In a read operation RD, the write enable signal /WE is maintained to a high level. In a write operation WR, the write enable signal /WE is activated to a low level in synchronization with the chip select signal /CS ((b) of FIG. 3). The address signals AD are supplied to the SRAM in synchronization with the chip select signal /CS ((c) of FIG. 3). The chip select signal /CS, the address signals AD, and the write enable signal /WE are output from a controller such as a central processing unit (CPU) that accesses the SRAM.

While the chip select signal /CS is being activated, the word decoder WDEC, such as the WDEC illustrated in FIG. 2, activates the address decode signal ADEC corresponding to the word line WL, which is indicated by the address signals AD, for example, the row address RAD, to a high level ((d) of FIG. 3). The control circuit CNTL illustrated in FIG. 1 activates the word activate signal WLP to a high level in synchronization with the chip select signal /CS ((e) of FIG. 3). An activation period of the word line WL is determined based on the word activate signal WLP. The NAND gate C1 that receives the address decode signal ADEC having a high level activates the word enable signal /WLEN to a low level in synchronization with the word activate signal WLP ((f) of FIG. 3).

The control circuit CNTL activates the word clock signal /WLCK to a low level in a given period in synchronization with the chip select signal /CS ((g) of FIG. 3). For example, an activation period ACT1 of the word clock signal /WLCK is determined based on a period in which the voltage of the word line WL reaches a high level. Because the word line WL is coupled to a large number of memory cells MC, the load capacitance of the word line WL is high. The transistors P11 and P12 having high drive capabilities are turned on in the activation period ACT1, whereby the voltage of the word line WL promptly changes from a low level to a high level when an access operation, such as the read operation or the write operation, starts.

The drive capability of the transistor N12 may be higher than that of each of the transistors P11 and P12. The transistor N12 causes a portion of a current that flows into the word line WL via the transistors P11 and P12 to flow to the ground line VSS as a through current. Accordingly, the high-level voltage of the word line WL decreases to a desired voltage by the transistor N12 having a high drive capability.

For example, when the drive capability of the transistor N12 is substantially the same as or similar to that of the NMOS transistor N1 or N3 of the memory cell MC, the electric characteristics of the transistor N12, which include the threshold voltage of the transistor N12 and so forth, are substantially the same as those of the transistor N1 or N3 of the memory cell MC. In this case, because the dimensions of the transistor N12 are small, for example, because the drive capability of the transistor N12 is low, the high-level voltage of the word line WL does not decreases to a desired voltage.

The through current that flows through the transistors P11, P12, and N12 having high capabilities is high. The activation period ACT1 is a portion of the activation period of the word line WL, for example, 20% to 50% of the activation period of the word line WL. Therefore, a current consumption of the SRAM may be smaller than that of the SRAM where the transistors P11, P12, and N12 are turned on in the activation period of the word line WL.

The word driver WDRV turns off the transistor N11 and turns on the transistors P11, P12, and N12 in synchronization with the word enable signal /WLEN having a low level and the word clock signal /WLCK having a low level. The voltage of the word line WL is set to a voltage Vbase that is determined in accordance with a ratio of the on-resistances of the transistors P11 and P12 to the on-resistance of the transistor N12 ((h) of FIG. 3).

The voltage Vbase is determined in accordance with the threshold voltages of the transistors P11, P12, and N12. The dimensions of the transistors P11, P12, and N12 are different from those of the transistors in the memory cell MC, and positions at which the transistors P11, P12, and N12 are provided are distant from the memory cell MC. Therefore, the threshold voltages of the transistors P11, P12, and N12 are different from those of the transistors in the memory cell MC. The variation in threshold voltage due to variations in production conditions of a semiconductor memory may be substantially the same in each PMOS transistor and each NMOS transistor. Thus, the voltage Vbase is set to a value according to the threshold voltages of the transistors of the memory cell MC.

On-resistances of the transfer transistors N3 and N4 of the memory cell MC increase because the voltage Vbase is lower than the power supply voltage VDD. Therefore, a static noise margin SNM of the memory cell MC is improved.

After the activation period ACT1, the word clock signal /WLCK is deactivated to a high level, whereby the transistors P11 and N12 are turned off ((i) of FIG. 3). Thereafter, the through current that flows through the transistors P11, P12, and N12 reduces. The transistors P21 and N21 are turned on by the high-level voltage of the word line WL. Thus, in an activation period ACT2 that is the remaining activation period of the word line WL, the through current flows from the power supply voltage line VDD to the ground line VSS via the transistors P21 and N21. The dimensions of the transistors P21 and N21 are substantially the same as those of the transistors P1 and N1 of the memory cell MC, and they may be, for example, small. The through current that flows through the transistors P21 and N21 is smaller than the through current that flows the transistors P11, P12, and N12. As such, the current consumption of the SRAM where the SRAM is accessed may be reduced.

The high-level voltage of the word line WL in the activation period ACT2 is set in accordance with a ratio of the on-resistance (the threshold voltage) of the transistor P21 to the on-resistance (the threshold voltage) of the transistor N21. Further, the voltage of the word line WL is set in accordance with resistance voltage division of the on-resistance of the transistor P21 and the on-resistance of the transistor N21. For example, when the threshold voltage of the transistor P21, for example, the absolute value of the threshold voltage of the transistor P21, is low, when the threshold voltage of the transistor N21, for example, the absolute value of the threshold voltage of the transistor N21, is high, or when the threshold voltage of the transistor P21, for example, the absolute value of the threshold voltage of the transistor P21, is low and the threshold voltage of the transistor N21, for example, the absolute value of the threshold voltage of the transistor N21, is high, the high-level voltage of the word line WL increases ((j) of FIG. 3). When the threshold voltage of the transistor P21, for example, the absolute value of the threshold voltage of the transistor P21, is high, when the threshold voltage of the transistor N21, for example, the absolute value of the threshold voltage of the transistor N21, is low, or when the threshold voltage of the transistor P21, for example, the absolute value of the threshold voltage of the transistor P21, is high and the threshold voltage of the transistor N21, for example, the absolute value of the threshold voltage of the transistor N21, is low, the high-level voltage of the word line WL decreases ((k) of FIG. 3). The transistors P21 and N21 are substantially the same as or similar to the transistors P2 and N2 of the memory cell MC, respectively. As such, the high-level voltage of the word line WL is adjusted in accordance with the electric characteristics of the transistors in the memory cell MC, which include the threshold voltages of the transistors and so forth.

The chip select signal /CS may be deactivated to a high level ((l) of FIG. 3). As such, the address decode signal ADEC is deactivated in synchronization with a change in the address signals AD ((m) of FIG. 3). Further, the word activate signal WLP is deactivated in synchronization with deactivation of the chip select signal /CS ((n) of FIG. 3). Still further, the word enable signal /WLEN is deactivated in synchronization with deactivation of the address decode signal ADEC or the word activate signal WLP ((o) of FIG. 3). Still further, the transistor P12 is turned off and the transistor P11 is turned on in synchronization with deactivated of the word enable signal /WLEN. Still further, the word line WL is deactivated to a low level ((p) of FIG. 3). Still further, the transistors P21 and N21 of the word line control circuit WLC are turned off by the level of the word line WL changing to a low level.

Figure 4:
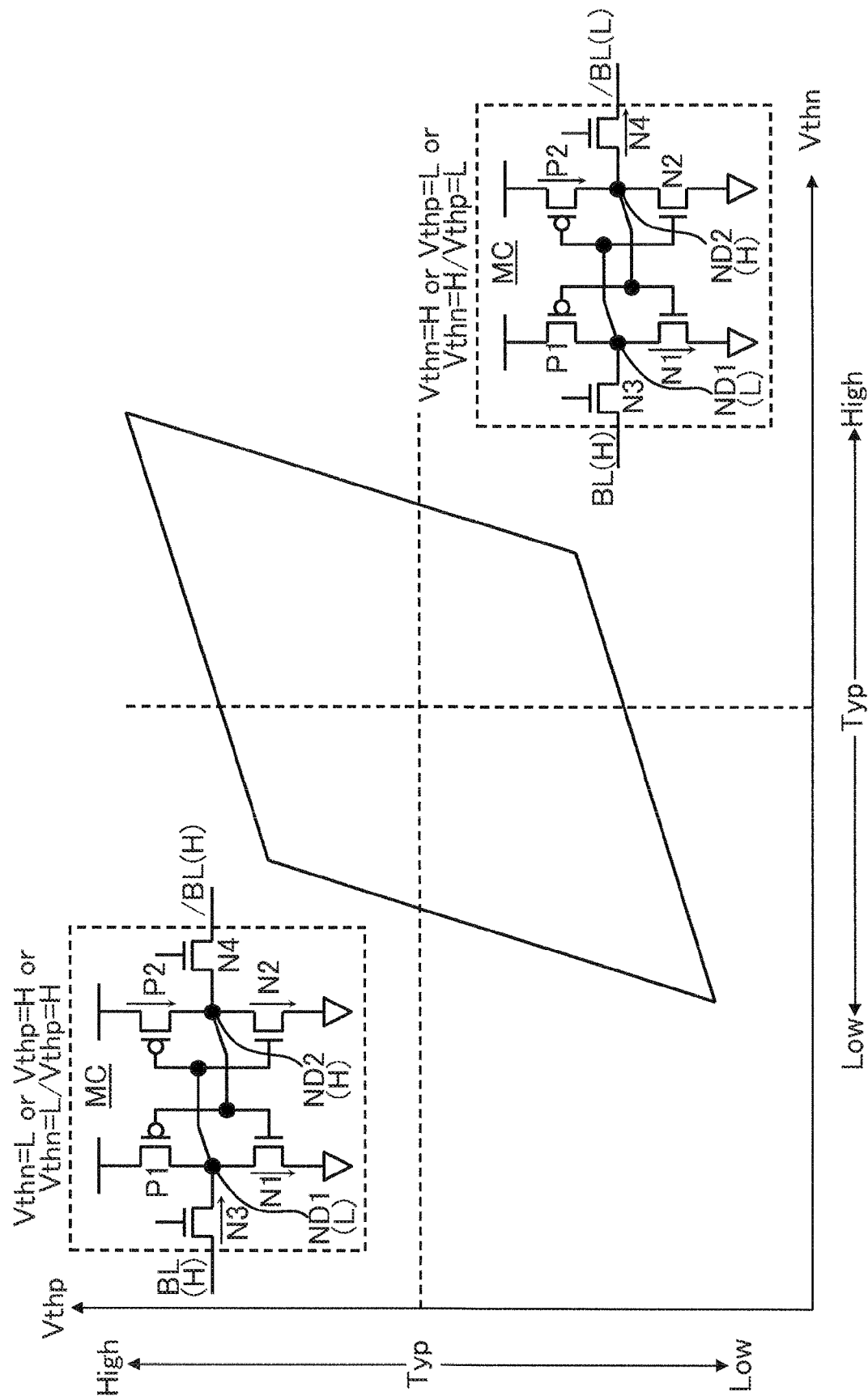
FIG. 4 illustrates exemplary electric characteristics of a memory cell.

FIG. 4 illustrates exemplary electric characteristics of a memory cell. For example, the electric characteristics of a memory cell illustrated in FIG. 4 may be the electric characteristics of the memory cell MC illustrated in FIG. 3. The horizontal axis indicates a threshold voltage Vthn of each of the NMOS transistors N1 to N4. The vertical axis indicates a threshold voltage vthp of each of the PMOS transistors P1 and P2. The broken lines Typ illustrated in FIG. 4 indicate typical values of the threshold voltages Vthn and vthp, for example, ideal values of the threshold voltages Vthn and Vthp. A region indicated by a parallelogram indicates specifications of the threshold voltages Vthn and Vthp. The threshold voltages Vthn and Vthp are measured on each chip or each wafer in a manufacturing process of the SRAM. Operation tests are performed on chips having the threshold voltages Vthn and Vthp that fall within the specifications.

In each of the memory cells MC illustrated in FIG. 4, a low level L is stored at a storage node ND1 that is provided on the transfer transistor N3 side, and a high level H is stored at a storage node ND2 that is provided on the transfer transistor N4 side. A read operation margin of the memory cell MC, for example, the static noise margin SNM of the memory cell MC, that is illustrated at the upper-left side of FIG. 4 is small. A write operation margin of the memory cell MC that is illustrated at the lower-right side of FIG. 4 is small.

In the read operation, the bit lines BL and /BL are precharged in advance to a high level H. When the threshold voltage Vthn of each of the NMOS transistors N1 to N4 is low, the on-resistance of the transfer transistor N3 decreases. The amount of a current that flows from the bit line BL to the storage node ND1 via the transfer transistor N3 increases. Because the threshold voltage Vthn of the driver transistor N1 is also low, the amount of a current that flows from the storage node ND1 to the ground line VSS increases. The voltage at the storage node ND1 may increase due to the current that flows from the bit line BL.

When the low level L is maintained at the storage node ND1, the transistor N2 is turned off. However, the transistor N2 may be turned on because of an increase in the voltage at the storage node ND1, for example, static noise. When the transistor N2 is turned on, data that is maintained in the memory cell MC may be broken. When the threshold voltage Vthn is low, the read operation margin, for example, the static noise margin SNM, reduces. Reduction of the read operation margin occurs when the threshold voltage Vthp of each of the PMOS transistors P1 and P2 is high, or when the threshold voltage Vthn of each of the NMOS transistors N1 to N4 is low and the threshold voltage Vthp of each of the PMOS transistors P1 and P2 is high. The above-mentioned malfunction in the read operation occurs in the memory cells MC into which data are not written in the write operation, for example, in the memory cells MC that are not selected by the column switches.

In the write operation, for example, the bit lines BL and /BL are set to a low level or a high level that is opposite to the level at the storage nodes ND1 and ND2, respectively, by the data input/output unit IOB. When the threshold voltage Vthn of each of the transistors N1 to N4 is high, the amount of a current that flows from the storage node ND2 to the bit line /BL decreases. A current that flows from the storage node ND2 to the ground line VSS via the driver transistor N2 decreases. Accordingly, the level at the storage node ND2 is not easily inverted to a low level. When the threshold voltage Vthn is high, the write operation margin reduces. Reduction of the write operation margin occurs when the threshold voltage Vthp of each of the PMOS transistors P11 and P12 is low, or when the threshold voltage Vthn of each of the NMOS transistors N1 to N4 is high and the threshold voltage Vthp of each of the PMOS transistors P11 and P12 is low.

In the circuit illustrated in FIG. 2, the threshold voltage of the transistor N21 of the word line control circuit WLC may be, for example, substantially the same as the threshold voltage Vthn of the NMOS transistor of the memory cell MC. The threshold voltage of the transistor P21 of the word line control circuit WLC may be, for example, substantially the same as the threshold voltage Vthp of the PMOS transistor of the memory cell MC. Because the on-resistance of the transistor N21 decreases when the threshold voltage Vthn is low, the high-level voltage of the word line WL decreases. Because the on-resistance of the transistor P21 increases when the threshold voltage Vthp is high, the high-level voltage of the word line WL decreases. Since the high-level voltage of the word line WL decreases, the on-resistance of the transfer transistor N3 increases. Under conditions of the threshold voltages in the memory cell MC illustrated at the upper-left side of FIG. 4, the amount of the current that flows from the bit line BL to the storage node ND1 is reduced, and the read operation margin is not reduced.

Because the on-resistance of the transistor N21 increases when the threshold voltage Vthn is high, the high-level voltage of the word line WL increases. Because the on-resistance of the transistor P21 decreases when the threshold voltage Vthp is low, the high-level voltage of the word line WL increases. Since the high-level voltage of the word line WL increases, the on-resistance of the transfer transistor N4 decreases. Under conditions of the threshold voltages in the memory cell MC illustrated at the lower-right side of FIG. 4, the amount of the current that flows from the bit line /BL to the storage node ND2 is increased, and the write operation margin is not reduced.

In the first embodiment, the transistors P11, P12 and N12 having high drive capabilities are turned on in the first activation period ACT1 that is included in the activation period of the word line WL. The transistors P21 and N21 having low drive capabilities are turned on in the second activation period ACT2 that is included in the activation period of the word line WL. The high-level voltage of the word line WL is promptly set to a desired voltage that is lower than the power supply voltage VDD without an increase in power consumption. The high-level voltage of the word line WL is set to an appropriate voltage according to the threshold voltages Vthp and Vthn of the memory cell MC. The high-level voltage of the word line WL is set to an appropriate voltage according to the threshold voltage Vthn and the threshold voltage Vthp. Thus, the read operation margin and the write operation margin are not reduced regardless of variations in the threshold voltages Vthp and Vthn, and as such the yield of the SRAMs is improved.

Figure 5:
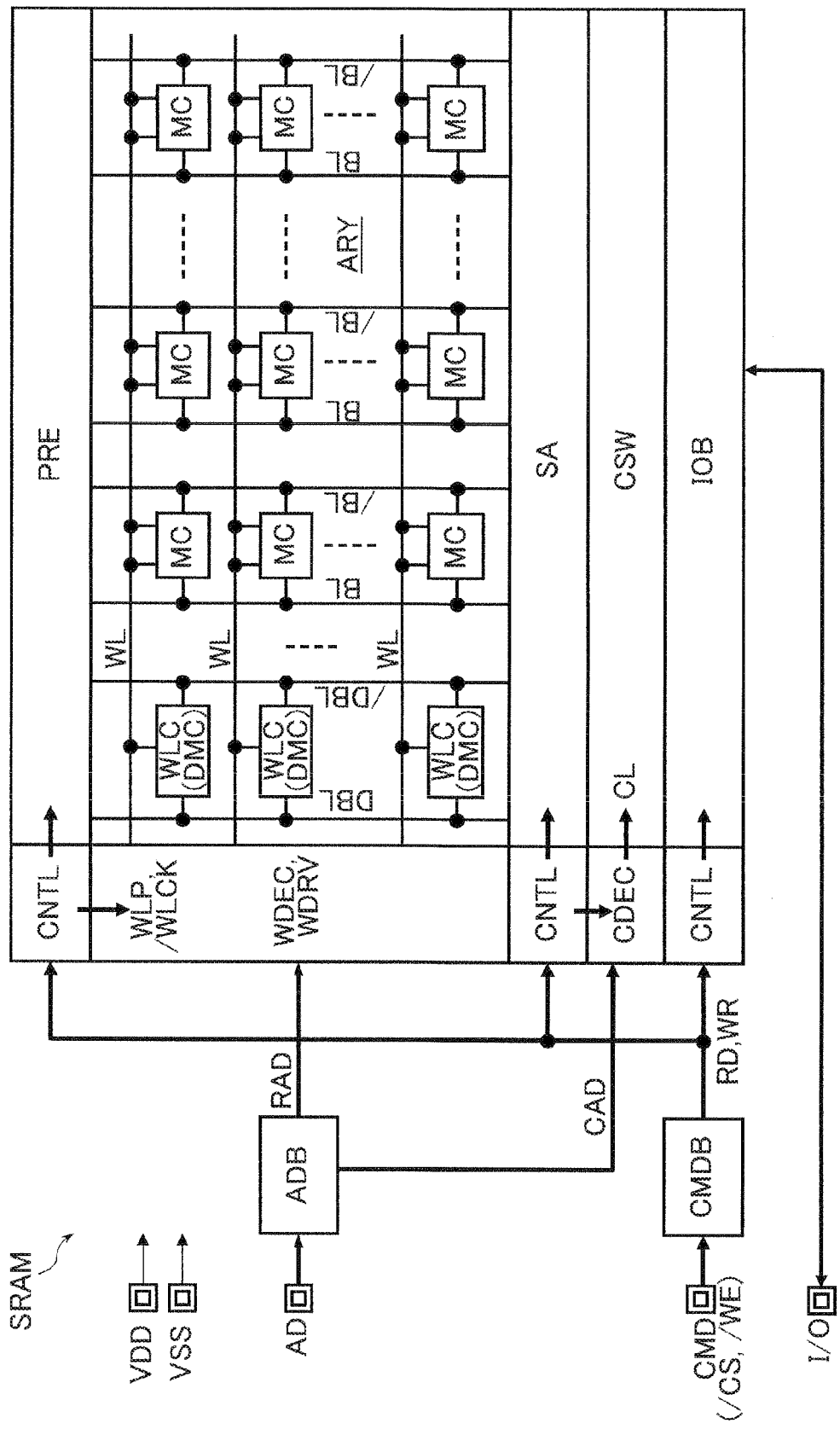
FIG. 5 illustrates a second embodiment.

FIG. 5 illustrates a second embodiment. Elements substantially the same as those in the first embodiment are denoted by the same reference numerals, and a description is omitted or reduced. Each of the word line control circuits WLC of the SRAM in the second embodiment includes a dummy memory cell DMC in the memory cell array ARY. The dummy memory cell DMC may include transistors that are substantially the same as the transistors P1, P2, and N1 to N4 of the memory cell MC. The dummy memory cells DMC may be provided at a pitch substantially the same as that of the memory cells MC. Dummy bit lines DBL and /DBL are disposed at sides of the dummy memory cell DMC at a pitch substantially the same as that of the bit lines BL and /BL. The configurations of the other elements of the word line control circuit WLC are substantially the same as or similar to those of the other elements of the word line control circuit WLC illustrated in FIG. 1. The word line control circuit WLC may be disposed outside the memory cell array ARY as illustrated in FIG. 1.

Figure 6:
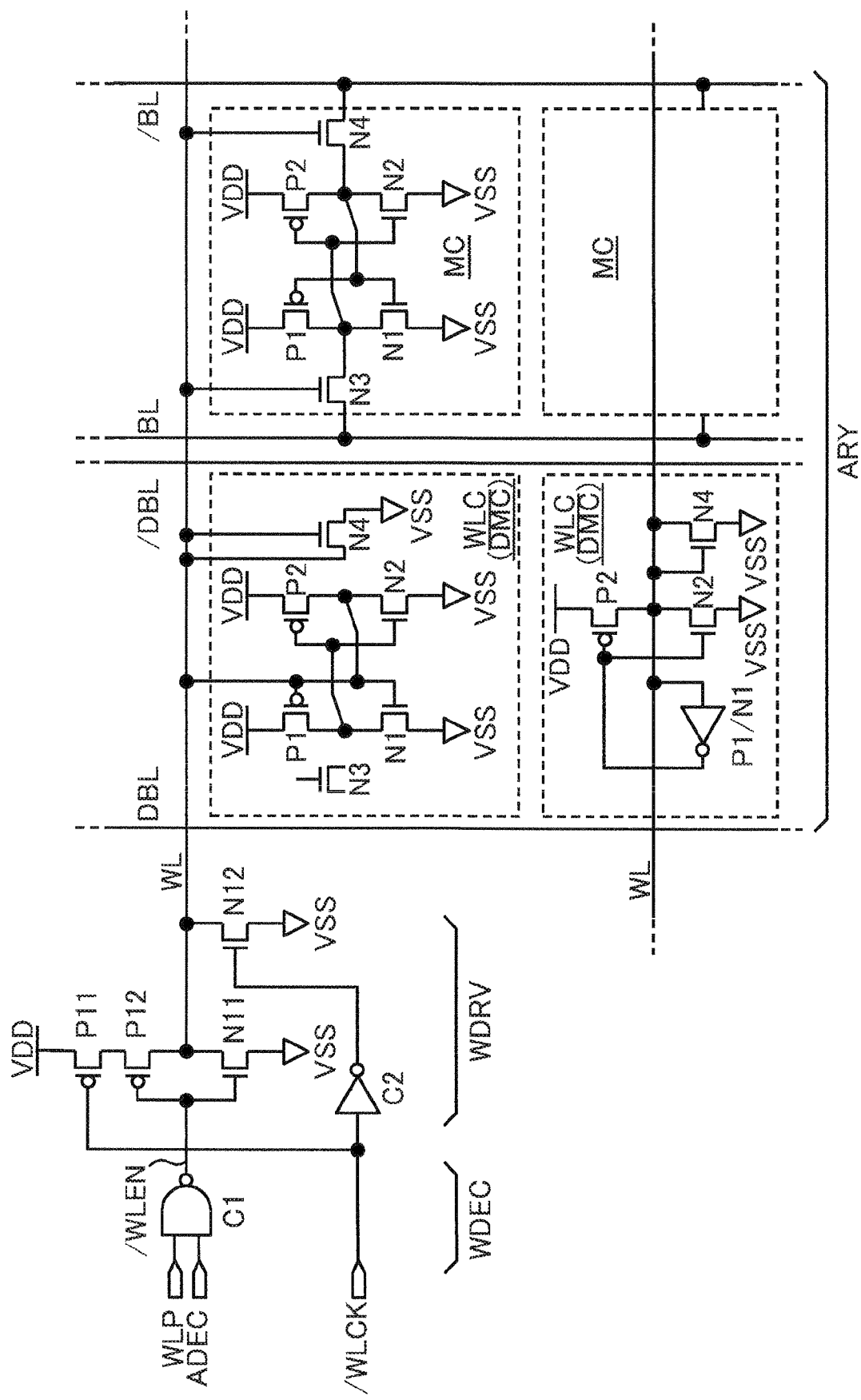
FIG. 6 illustrates an exemplary word decoder, an exemplary word driver, and an exemplary word line control circuit.

FIG. 6 illustrates an exemplary word decoder, an exemplary word driver, and an exemplary word line control circuit. The exemplary word decoder, the exemplary word driver, and the exemplary word line control circuit may be the word decoder WDEC, one of the word drivers WDRV, and the word line control circuit WLC illustrated in FIG. 5, respectively. Each of the memory cells MC may be, for example, substantially the same as the memory cell illustrated in FIG. 2. Although each of the dummy memory cells DMC may have a structure which is substantially the same as that of the memory cell MC, some of wiring patterns of the transistors of the dummy memory cell DMC may be different from wiring patterns of the memory cell MC. The configurations of the other elements of the dummy memory cell DMC are substantially the same as or similar to those of the other elements of the memory cell MC illustrated in FIG. 2. The dummy memory cell DMC illustrated at the bottom of FIG. 6 may be an equivalent circuit.

The word line control circuit WLC, for example, the equivalent circuit, includes the PMOS transistor P2, the NMOS transistor N2, a CMOS inverter P1/N1, and the NMOS transistor N4. The transistors P2 and N2 are disposed in series between the power supply voltage line VDD and the ground line VSS. The CMOS inverter P1/N1 inverts a signal of the word line WL, and outputs the inverted signal to the gates of the transistors P2 and N2. The NMOS transistor N4 is disposed in series between the word line WL and the ground line VSS.

The word line control circuit WLC includes the transistor N2 whose gate receives the output of the CMOS inverter P1/N1 in addition to the elements in the word line control circuit WLC illustrated in FIG. 2. An operation of the word line control circuit WLC is, for example, substantially the same as that of the word line control circuit WLC illustrated in FIG. 3.

Advantages in the second embodiment are substantially the same as those in the first embodiment. The word line control circuit WLC includes the dummy memory cell DMC having a structure substantially the same as that of the memory cell MC. Thus, the high-level voltage of the word line WL is accurately set in accordance with the electric characteristics of the transistors in the memory cell MC.

Figure 7:
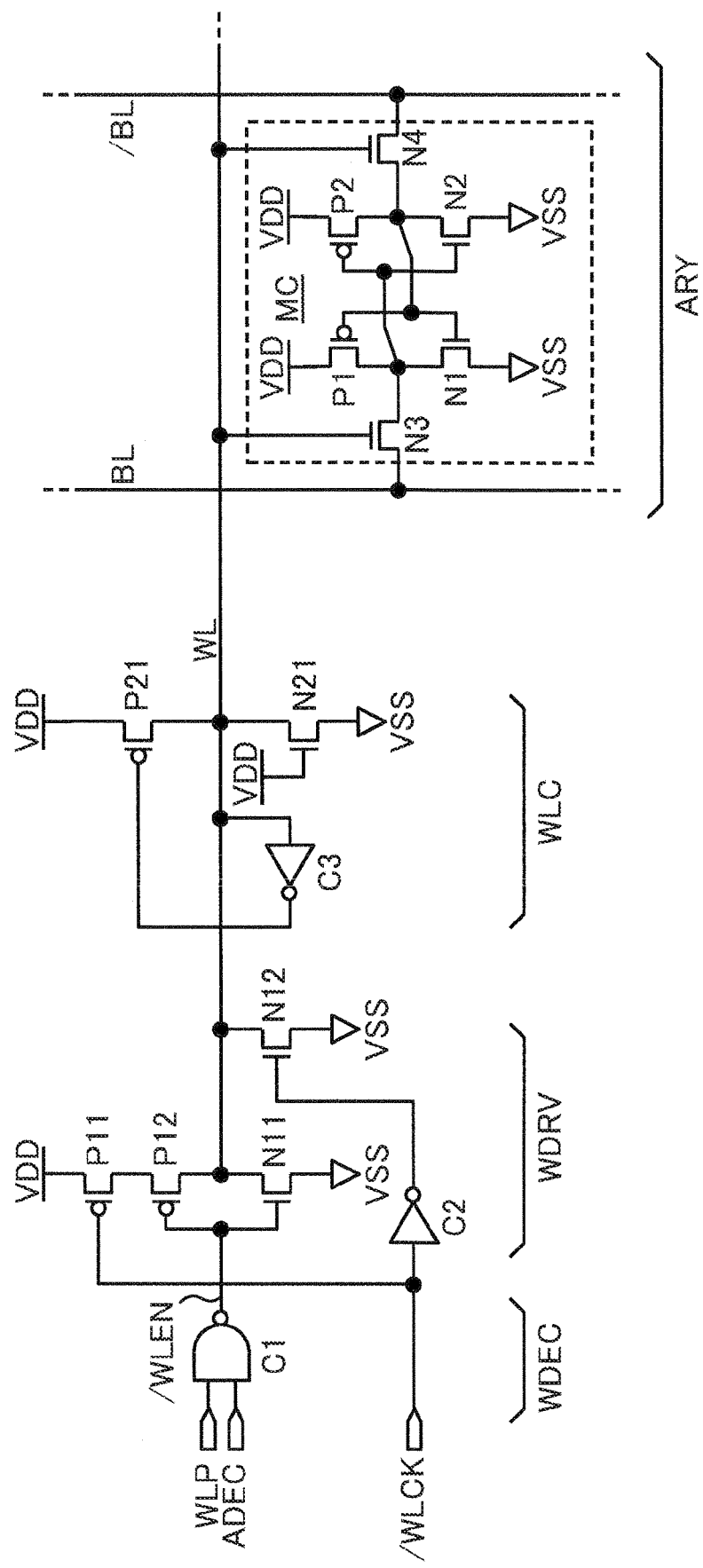
FIG. 7 illustrates a third embodiment.

FIG. 7 illustrates a third embodiment. FIG. 7 illustrates an exemplary word decoder WDEC, exemplary word drivers WDRV, and an exemplary word line control circuits WLC. Elements substantially the same as those in the first and second embodiments are denoted by the same reference numerals, and a description is omitted or reduced. The memory cell MC illustrated in FIG. 7 may be, for example, substantially the same as the memory cell MC illustrated in FIG. 2. A semiconductor memory may be, for example, the SRAM.

The gate of the NMOS transistor N21 of the word line control circuit WLC is coupled to the power supply voltage line VDD. The configurations of the other elements of the word line control circuit WLC are substantially the same as or similar to those of the other elements of the word line control circuit WLC illustrated in FIG. 2. An operation of the word line control circuit WLC is substantially the same as or similar to that of the word line control circuit WLC illustrated in FIG. 3. Advantages that are substantially the same as or similar to those in each of the above-described embodiments may be also obtained in the third embodiment.

Figure 8:
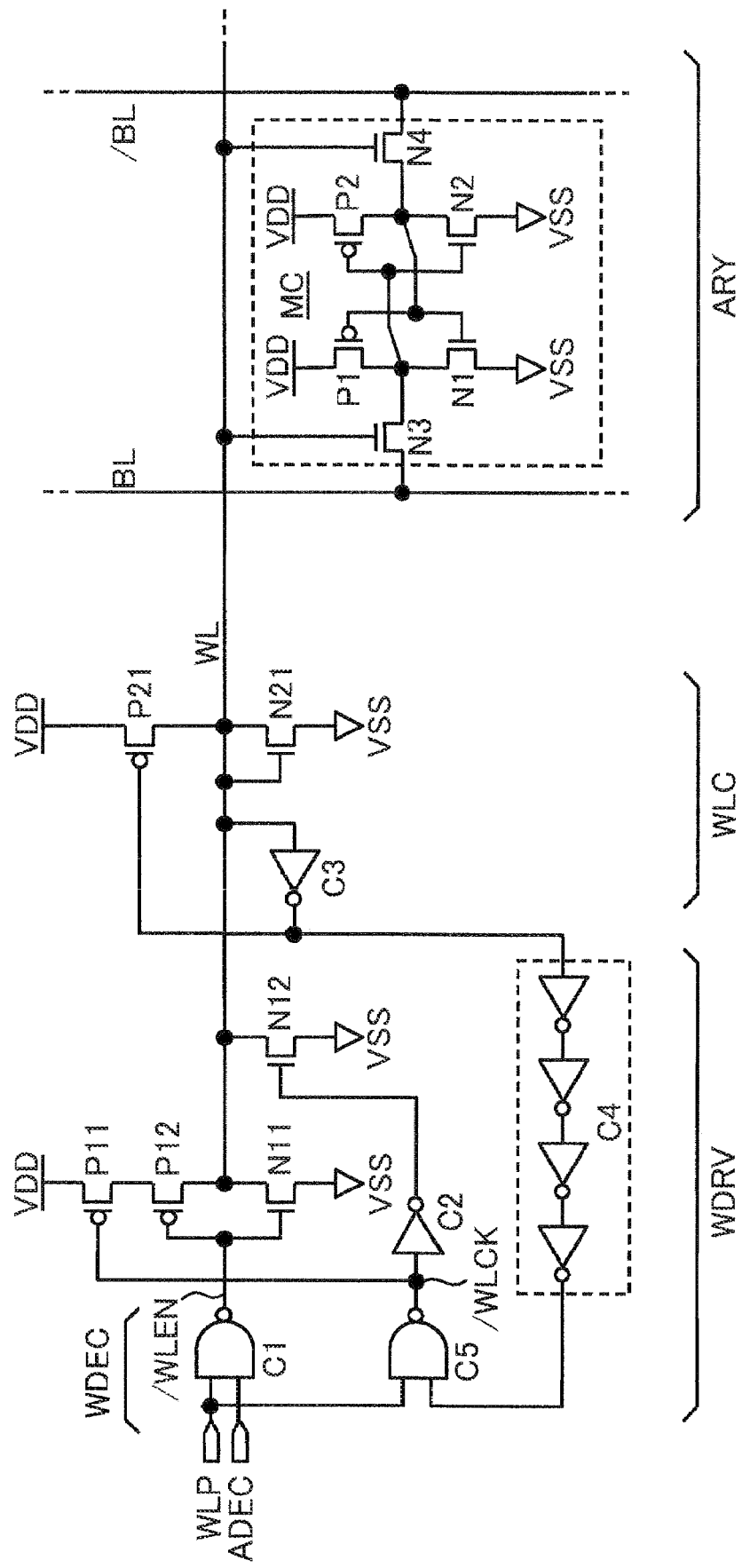
FIG. 8 illustrates a fourth embodiment.

FIG. 8 illustrates a fourth embodiment. FIG. 8 illustrates an exemplary word decoder WDEC, exemplary word drivers WDRV, and exemplary word line control circuit WLC. Elements substantially the same as those in the first to third embodiments are denoted by the same reference numerals, and a description is omitted or reduced. The memory cell MC illustrated in FIG. 8 may be, for example, the memory cell MC illustrated in FIG. 2.

The word driver WDRV includes a delay circuit C4 and a NAND gate C5. The delay circuit C4 receives the output of the inverter C3 of the word line control circuit WLC. The NAND gate C5 receives the word activate signal WLP and an output signal of the delay circuit C4, and generates the word clock signal /WLCK. In the fourth embodiment, for example, the control circuit CNTL illustrated in FIG. 1 does not generate the word clock signal /WLCK.

The delay circuit C4 includes an even number of inverters that are cascaded. A delay time of the delay circuit C4 may be substantially equal to the activation period ACT1 illustrated in FIG. 3. The delay circuit C4 outputs a low-level deactivation signal to the NAND gate C5 after the activation period ACT1 elapsed from the word line WL being activated. For example, without using the control circuit CNTL, the delay circuit C4 generates the word clock signal /WLCK having a waveform which is substantially the same as that of the word clock signal /WLCK illustrated in FIG. 3. The gate of the transistor N21 of the word line control circuit WLC may be coupled to the power supply voltage line VDD as illustrated in FIG. 7. The delay circuit C4 may be disposed in the word line control circuit WLC. The delay circuit C4 may include an odd number of inverters that are cascaded, and the word line WL may be coupled to the input of the delay circuit C4.

Advantages in the fourth embodiment are substantially the same as those in each of the previous embodiments. In the fourth embodiment, timing at which the word clock signal /WLCK is deactivated, for example, a rising edge of the word clock signal /WLCK, is generated in response to a change in the voltage of the word line WL. Therefore, an end time of the activation period ACT1 is set to a time when a given time elapses after the word line WL being activated. The activation period ACT1 is set so that the through current flows the transistors P11, P12, and N12 is minimized, whereby the current consumption when the SRAM is accessed is reduced.

Even when a leak current is high because the threshold voltage of the transistor of the memory cell MC is low, the number of SRAMs having current consumptions that exceed a specification of current consumption reduces. Thus, the yield of the SRAMs is improved.

Figure 9:
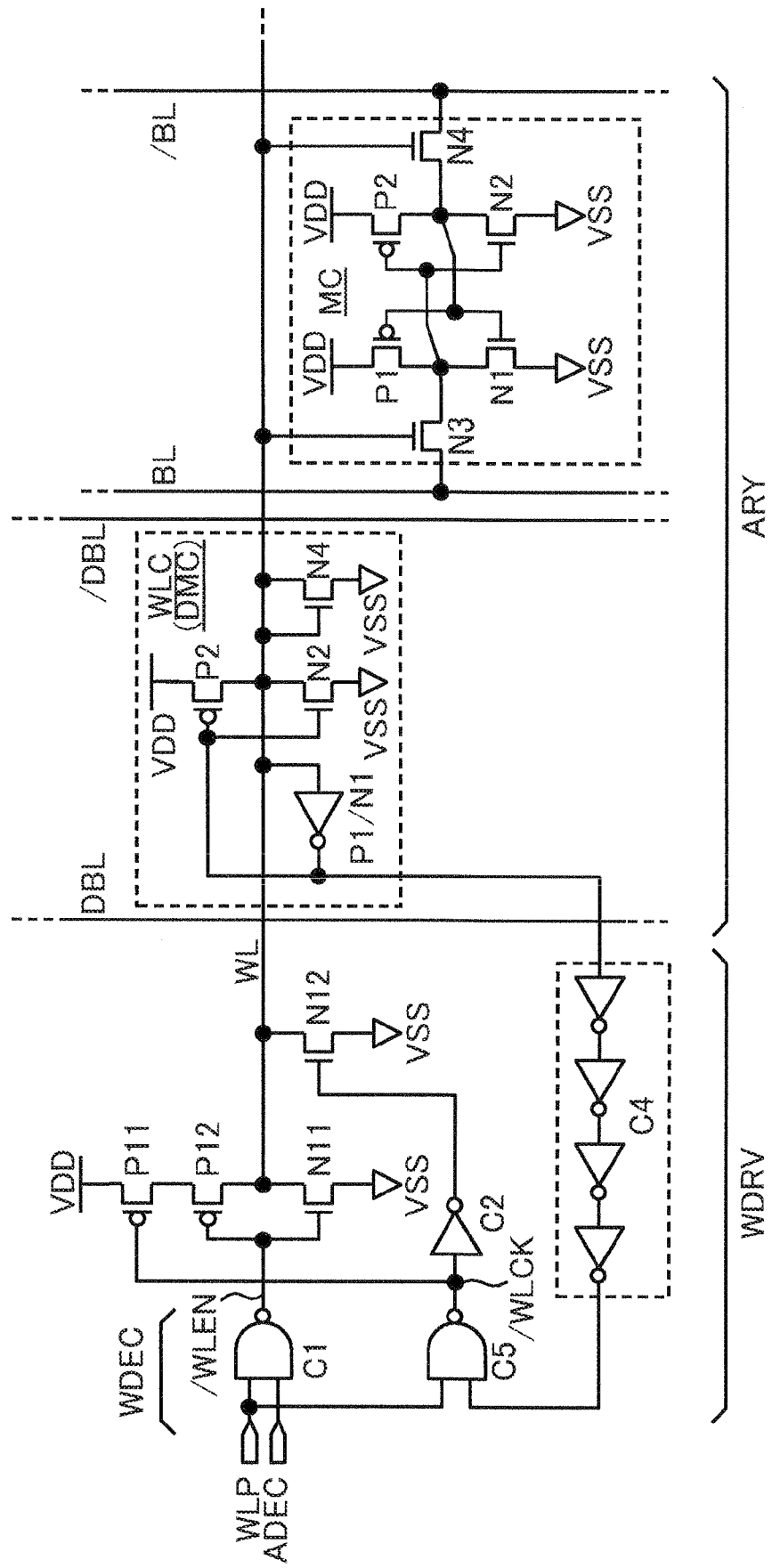
FIG. 9 illustrates a fifth embodiment.

FIG. 9 illustrates a fifth embodiment. FIG. 9 illustrates an exemplary word decoder WDEC, exemplary word drivers WDRV, and exemplary word line control circuits WLC. Elements substantially the same as those in the first to fourth embodiments are denoted by the same reference numerals, and a description is omitted or reduced. The memory cell MC illustrated in FIG. 9 may be, for example, the memory cell MC illustrated in FIG. 2. A semiconductor memory may be the SRAM.

The word line control circuit WLC includes the dummy memory cell DMC as illustrated in FIG. 6. The word driver WDRV includes the delay circuit C4 and the NAND gate C5 as illustrated in FIG. 8. Because the word clock signal /WLCK is generated using the NAND gate C5, for example, the control circuits CNTL illustrated in FIG. 1 does not generate the word clock signal /WLCK. An operation of the word line control circuit WLC is substantially the same as or similar to that of the word line control circuit WLC illustrated in FIG. 3. Advantages in the fifth embodiment are substantially the same as those in each of the previous embodiments.

Figure 10:
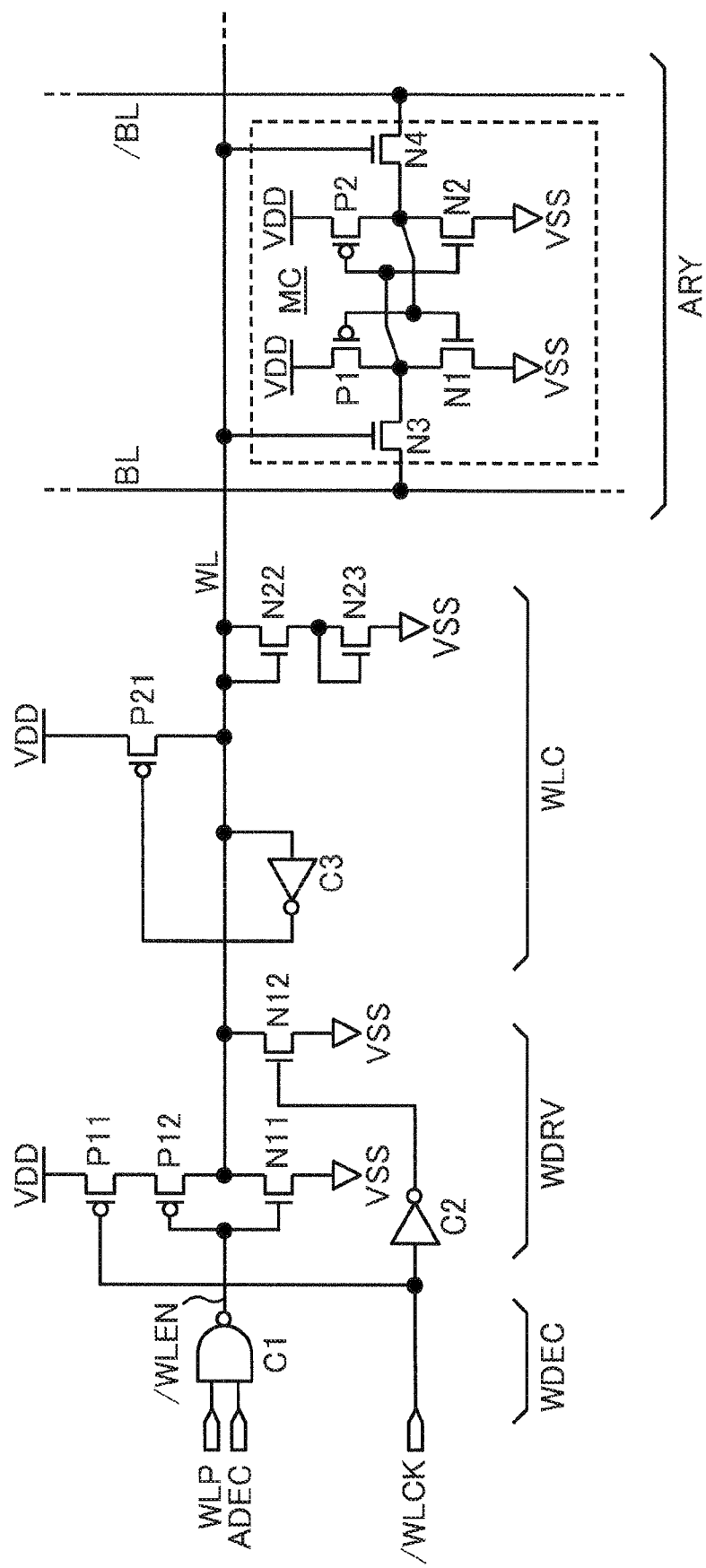
FIG. 10 illustrates a sixth embodiment.

FIG. 10 illustrates a sixth embodiment. FIG. 10 illustrates an exemplary word decoder WDEC, exemplary word driver WDRV, and exemplary word line control circuits WLC. Elements substantially the same as those in the previous embodiments are denoted by the same reference numerals, and a detail description is omitted or reduced. The memory cell MC illustrated in FIG. 10 may be substantially the same as the memory cell MC illustrated in FIG. 2. A semiconductor memory may be the SRAM.

The word line control circuit WLC does not include, for example, the transistor N21 illustrated in FIG. 2. The word line control circuit WLC includes NMOS transistors N22 and N23 that are diode-coupled. The gate of the transistor N22 is coupled to the word line WL. The gate of the transistor N23 is coupled to the source of the transistor N22. The configurations of the other elements of the word line control circuit WLC are substantially the same as or similar to those of the other elements of the word line control circuit WLC illustrated in FIGS. 1 and 2 except that the dimensions of the transistors of the word line control circuit WLC are different.

The word line control circuit WLC may include the dummy memory cell DMC provided in the memory cell array ARY as illustrated in FIGS. 5 and 6. The word clock signal /WLCK may be generated using the delay circuit C4 illustrated in FIG. 8.

Figure 11:
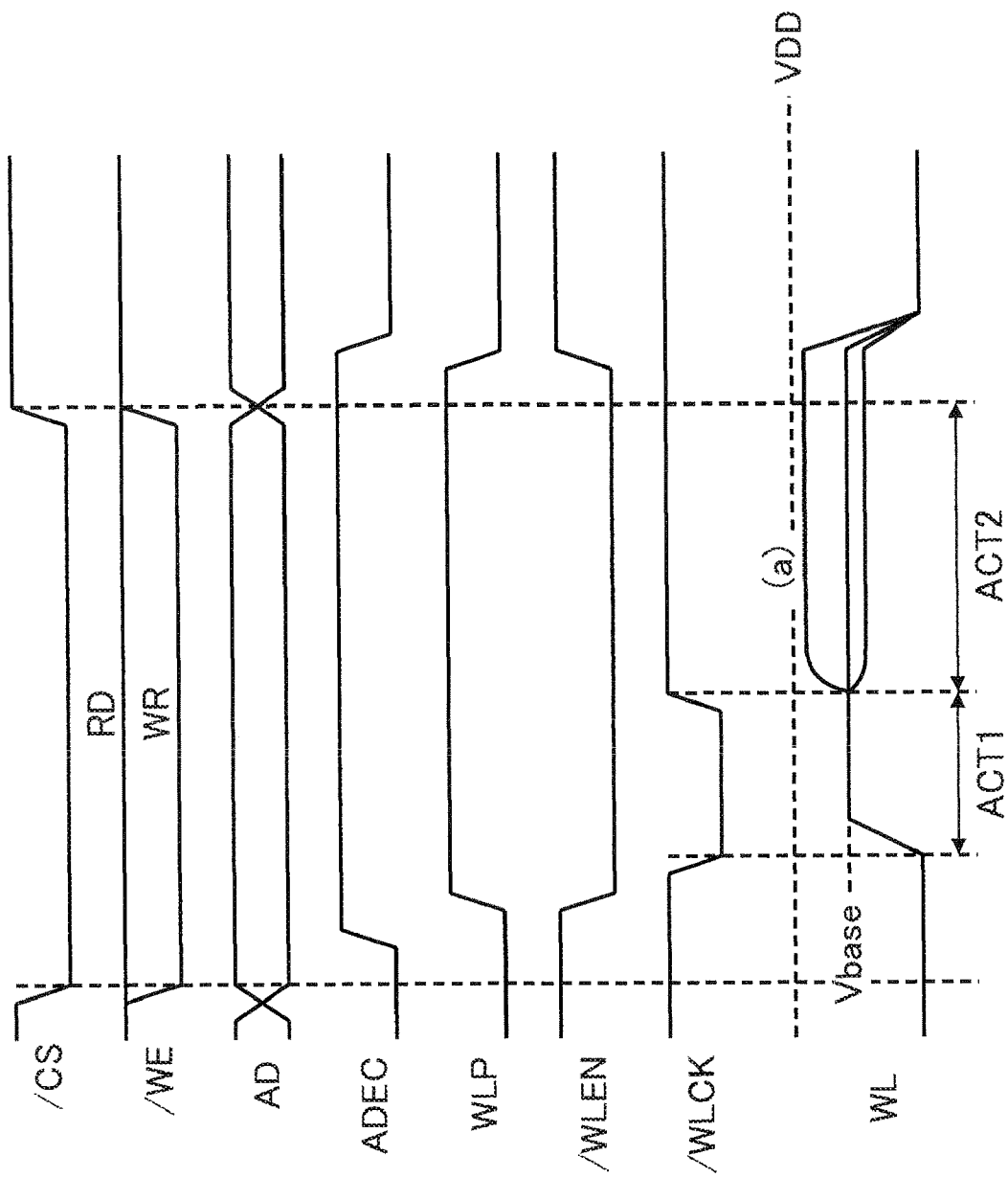
FIG. 11 illustrates exemplary operations of a word decoder, a word driver, and a word line control circuit.

FIG. 11 illustrates exemplary operations of a word decoder, a word driver, and a word line control circuit. The word decoder, the word driver, and the word line control circuit may be the word decoder WDEC, the word driver WDRV, and the word line control circuit WLC illustrated in FIG. 10, respectively. A voltage of the word line WL in the activation period ACT2 is different from the voltage of the word line WL illustrated in FIG. 3. The other operations illustrated in FIG. 11 are substantially the same as or similar to the operations illustrated in FIG. 3.

In the sixth embodiment, when the threshold voltage Vthn of the NMOS transistor of the memory cell MC is high, for example, the transistors N22 and N23 illustrated in FIG. 10 are not easily turned on. Therefore, when the threshold voltage Vthn of the NMOS transistor is high, the high-level voltage of the word line WL in the activation period ACT2 increases ((a) of FIG. 11). Since the high-level voltage of the word line WL increases, the on-resistances of the transfer transistors N3 and N4 of the memory cell MC decrease. Thus, the write operation margin is improved.

The threshold voltage of the transistor P21 illustrated in FIG. 10 is designed so that the voltage of the word line WL in the activation period ACT2 is set to the reference voltage Vbase illustrated in FIG. 3 when the threshold voltages Vthn and Vthp of the transistors of the memory cell MC are the typical values Typ. Advantages in the sixth embodiment are substantially the same as those in each of the previous embodiments.

Figure 12:
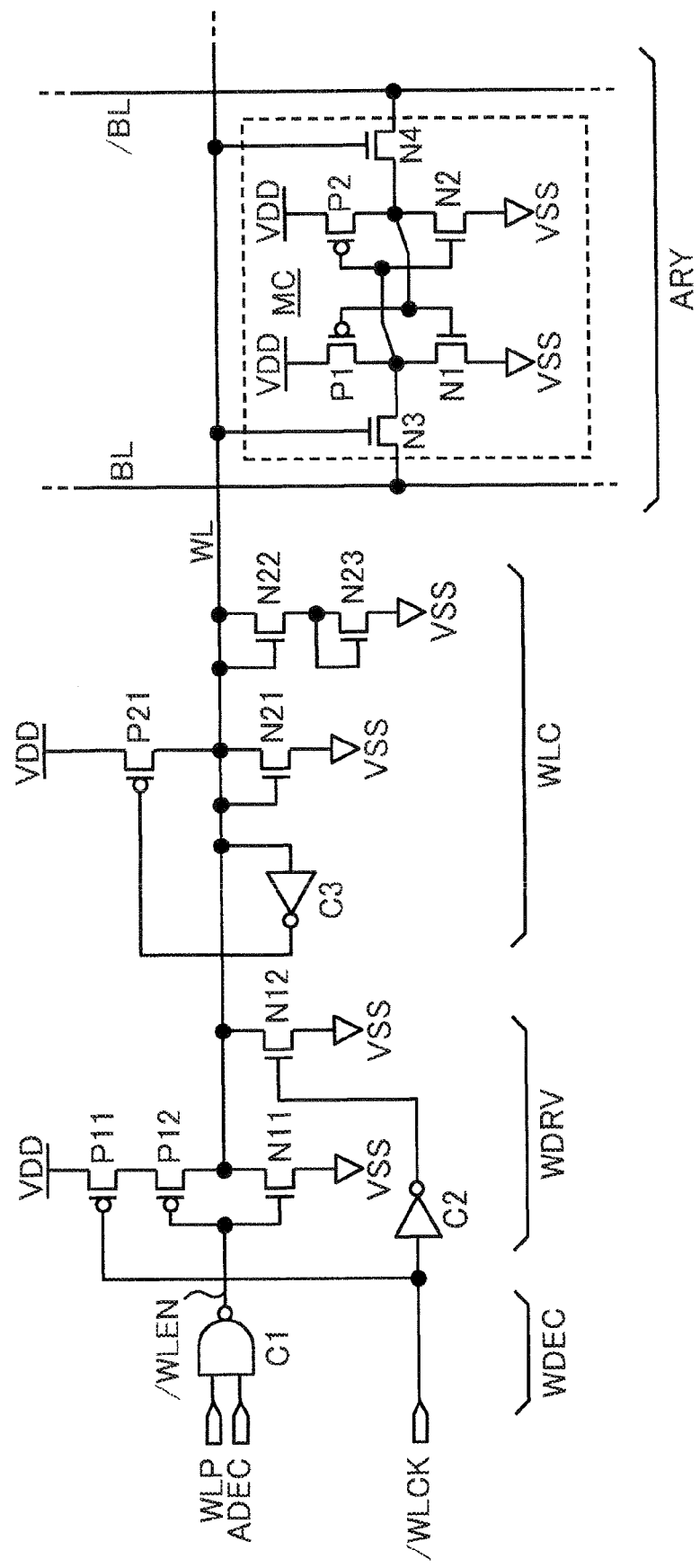
FIG. 12 illustrates a seventh embodiment.

FIG. 12 illustrates a seventh embodiment. FIG. 12 illustrates an exemplary word decoder, exemplary word driver, and exemplary word line control circuit. Elements substantially the same as those in the first to sixth embodiments are denoted by the same reference numerals, and a description is omitted or reduced. The memory cell MC illustrated in FIG. 12 may be, for example, substantially the same as the memory cell MC illustrated in FIG. 2. A semiconductor memory may be, for example, the SRAM.

In the seventh embodiment, for example, the diode-coupled NMOS transistors N22 and N23 illustrated in FIG. 10 are added to the word line control circuit WLC illustrated in FIG. 2. The configurations of the other elements of the word line control circuit WLC are substantially the same as or similar to those of the other elements of the word line control circuit WLC illustrated in FIGS. 1 and 2. The word line control circuit WLC may include the dummy memory cell DMC in the memory cell array ARY as illustrated in FIGS. 5 and 6. The delay circuit C4 illustrated in FIG. 8 may generate the word clock signal /WLCK. Advantages in the seventh embodiment are substantially the same as those in the previous embodiments.

Example embodiments of the present invention have now been described in accordance with the above advantages. It will be appreciated that these examples are merely illustrative of the invention. Many variations and modifications will be apparent to those skilled in the art.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B: or X employs both A and B. In addition, the articles "a" and "an" as used in this application and the appended claims should generally be construed to mean "one or more" unless specified otherwise or clear from the context to be directed to a singular form.

What is claimed is:

1. A semiconductor memory comprising:
a memory cell;
a word line coupled to a transfer transistor of the memory cell;
a word driver configured to activate the word line;
a first resistance portion configured to couple the word line to a low-level voltage line in accordance with an activation of the word line and to release connection after a first period in an activation period of the word line elapses;
a second resistance portion configured to couple the word line to a high-level voltage line in a second period in the activation period wherein the second period is not included in the first period; and
a third resistance portion configured to couple the word line to the low-level voltage line in the second period, the resistance of the third resistance portion being higher than a resistance of the first resistance portion,
wherein a high-level voltage of the word line in the second period is lower than that of the high-level voltage line by a resistance voltage division of the second resistance portion and the third resistance portion.

2. The semiconductor memory according to claim 1, wherein the first resistance portion, the second resistance portion, and the third resistance portion include transistors that operates as resistors, and
wherein at least one dimension of the transistor of the third resistance portion is smaller than that of the transistor of the first resistance portion.

3. The semiconductor memory according to claim 2, wherein the transistor of the second resistance portion includes a p-channel metal oxide semiconductor transistor, at least one dimension of which being substantially the same as that of a p-channel metal oxide semiconductor transistor of the memory cell, and
wherein the transistor of the third resistance portion includes an n-channel metal oxide semiconductor transistor, at least one dimension of which being substantially the same as that of an n-channel metal oxide semiconductor transistor of the memory cell.

4. The semiconductor memory according to claim 1, wherein the second resistance portion includes a p-channel metal oxide semiconductor transistor whose gate receives a signal obtained by inverting a signal of the word line, whose source is coupled to the high-level voltage line, and whose drain is coupled to the word line, and
wherein the third resistance portion includes an n-channel metal oxide semiconductor transistor whose gate and drain are coupled to the word line, and whose source is coupled to the low-level voltage line.

5. The semiconductor memory according to claim 1, wherein the second resistance portion includes a p-channel metal oxide semiconductor transistor whose gate receives a signal obtained by inverting a signal of the word line, whose source is coupled to the high-level voltage line, and whose drain is coupled to the word line, and
wherein the third resistance portion includes an n-channel metal oxide semiconductor transistor whose drain is coupled to the word line, whose gate is coupled to the high-level voltage line, and whose source is coupled to the low-level voltage line.

6. The semiconductor memory according to claim 1, wherein the second resistance portion includes a p-channel metal oxide semiconductor transistor whose gate receives a signal obtained by inverting a signal of the word line, whose source is coupled to the high-level voltage line, and whose drain is coupled to the word line, and
wherein the third resistance portion includes a plurality of n-channel metal oxide semiconductor transistors that are diode-connected in series between the word line and the low-level voltage line.

7. The semiconductor memory according to claim 1, further comprising a dummy memory cell corresponding to the memory cell,
wherein the second resistance portion and the third resistance portion include a transistor of the dummy memory cell.

8. The semiconductor memory according to claim 7, wherein the dummy cell includes a memory cell that is substantially the same as the memory cell.

9. The semiconductor memory according to claim 1, further comprising a delay circuit configured to output a deactivation signal after the first period elapsing,
wherein the first resistance portion releases connection of the word line in response to the deactivation signal.

10. The semiconductor memory according to claim 8, wherein the delay circuit receives a signal that changes in response to at least one of a voltage of the word line and a change in the voltage of the word line.

11. The semiconductor memory according to claim 1, wherein the memory cell is a static memory cell.

* * * * *